United States Patent
Benson

(10) Patent No.: US 10,404,313 B1
(45) Date of Patent: Sep. 3, 2019

(54) LOW NOISE AMPLIFIERS WITH OUTPUT LIMITING

(71) Applicant: ANALOG DEVICES, INC., Norwood, MA (US)

(72) Inventor: Keith Benson, Hopkinton, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/901,071

(22) Filed: Feb. 21, 2018

(51) Int. Cl.
H04B 1/16 (2006.01)
H04B 1/44 (2006.01)
H03F 3/19 (2006.01)
H03F 3/24 (2006.01)

(52) U.S. Cl.
CPC ............... H04B 1/44 (2013.01); H03F 3/19 (2013.01); H03F 3/245 (2013.01); *H03F 2200/294* (2013.01); *H03F 2200/336* (2013.01); *H03F 2200/451* (2013.01)

(58) Field of Classification Search
CPC ... H04B 1/44; H04B 1/04; H04B 1/16; H04B 1/40; H03F 3/245; H03F 3/19; H03F 2200/294; H03F 2200/336; H03F 2200/451
See application file for complete search history.

(56) References Cited

U.S. PATENT DOCUMENTS

| | | |
|---|---|---|
| 5,722,062 A | 2/1998 | Nakanishi et al. |
| 5,802,463 A | 9/1998 | Zuckerman |
| 6,684,033 B1 * | 1/2004 | Doh .................... H04B 10/6931 375/225 |
| 6,747,484 B1 * | 6/2004 | Adlerstein ............. H03G 11/04 327/172 |
| 6,965,655 B1 * | 11/2005 | Mostov ................ H03G 3/3068 375/345 |
| 8,120,428 B2 | 2/2012 | Montalvo et al. |
| 8,244,192 B2 | 8/2012 | Prasidh et al. |

(Continued)

FOREIGN PATENT DOCUMENTS

| | | |
|---|---|---|
| CN | 102868369 A | 1/2013 |
| JP | 2010057025 A | 3/2010 |
| WO | WO2017111975 A1 | 6/2017 |

OTHER PUBLICATIONS

Colangeli, Sergio, " GaN-Based Robust Low-Noise Amplifiers," IEEE Transactions on Electron Devices, vol. 60, No. 10, Oct. 2013, pp. 3238-3248.

(Continued)

*Primary Examiner* — Andrew Wendell
(74) *Attorney, Agent, or Firm* — Knobbe, Martens, Olson & Bear, LLP

(57) ABSTRACT

Low noise amplifiers (LNAs) with output limiting are provided herein. In certain implementations, a gallium nitride (GaN) LNA includes LNA amplification circuitry and an output limiter that is connected to an output of the LNA amplification circuitry and operable to limit an output power of the GaN LNA. By limiting the output signal power, a number of benefits are achieved, including protection of downstream circuitry receiving the GaN LNA's output signal. For example, such downstream circuitry can be fabricated using silicon or other fabrication technology associated with a lower signal power handling capability relative to that of the GaN LNA.

20 Claims, 11 Drawing Sheets

(56) References Cited

U.S. PATENT DOCUMENTS

| | | | |
|---|---|---|---|
| 8,665,022 B2 | 3/2014 | Kobayashi | |
| 8,829,999 B2 | 9/2014 | Fisher | |
| 9,373,613 B2 | 6/2016 | Quaglietta et al. | |
| 9,374,048 B2 | 6/2016 | Koyama et al. | |
| 9,628,023 B2 | 4/2017 | Zhang | |
| 9,742,445 B1 | 8/2017 | Actis et al. | |
| 2004/0007776 A1* | 1/2004 | Chen | H01L 23/552 257/738 |
| 2014/0167862 A1* | 6/2014 | Khatri | H02H 9/043 330/298 |
| 2015/0118977 A1 | 4/2015 | Emmanuel | |
| 2016/0330795 A1* | 11/2016 | Choi | H01L 21/8258 |
| 2017/0279415 A1* | 9/2017 | Wallis | H03F 1/523 |
| 2017/0338570 A1* | 11/2017 | Myers | H04B 1/00 |
| 2018/0226367 A1* | 8/2018 | Babcock | H04B 1/0475 |

OTHER PUBLICATIONS

Krausse, et al., "Robust GaN HEMT Low-Noise Amplifier MMICs for X-Band Applications," 12th GAAS Symposium-Amsterdamn, 2004, pp. 71-74.

Pantellini, et al., "Performance Assessment of GaN HEMT Technologies for Power Limiter and Switching Applications," Proceedings of the 5th European Microwave Inegrated Circuits Conference; SELEX Sistemi Integrati SpA, via Tiburtina Km. 12,400, Rome 00131, Italy, Sep. 27-28, 2010, pp. 45-48.

Rudolph et al., "Analysis of the Survivability of GaN Low-Noise Amplifiers," IEEE Transactions on Microwave Theory and Techniques, vol. 55, No. 1, Jan. 2007, pp. 37-43.

Xu, et al., "A C-Band High-Dynamic Range GaN HEMT Low-Noise Amplifier," IEEE Microwave and Wireless Components Letters, vol. 14, No. 6, Jun. 2004, pp. 262-264.

* cited by examiner

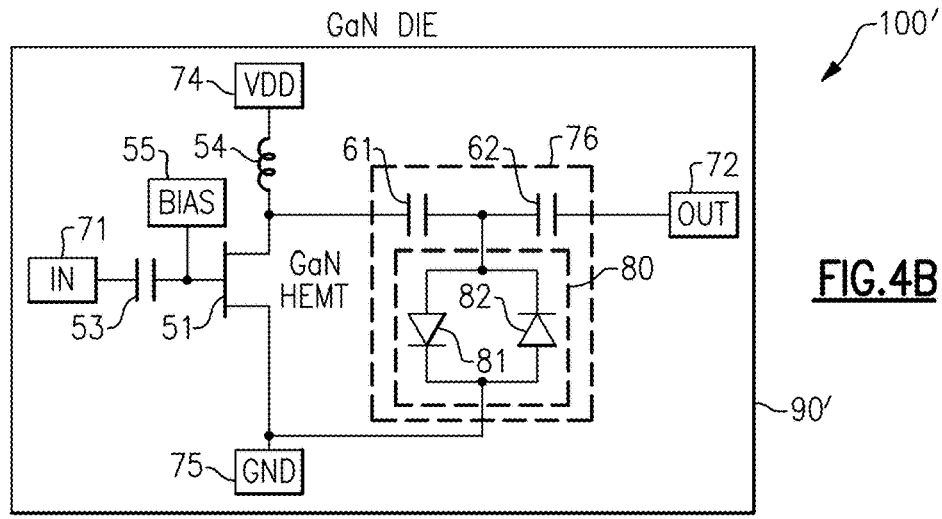
FIG. 4B
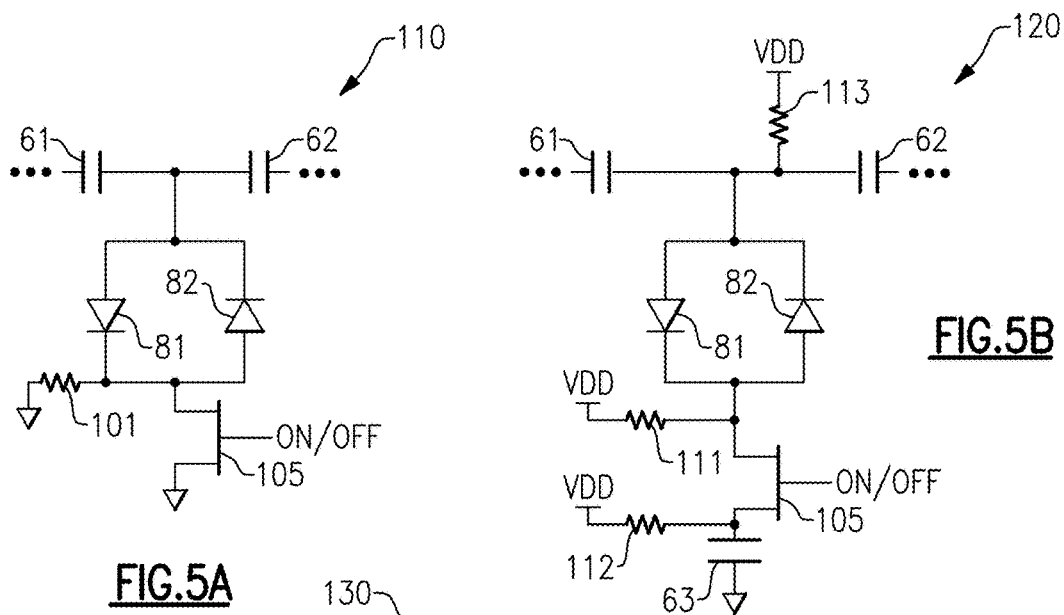
FIG. 5A
FIG. 5B
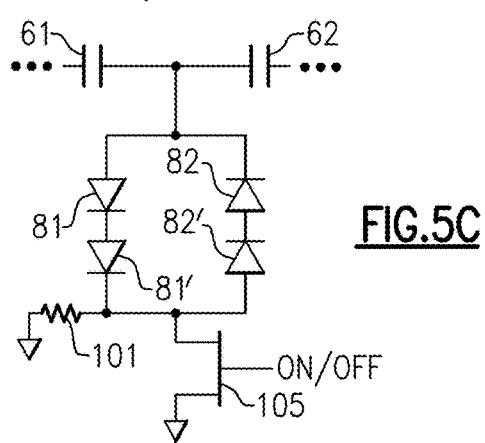
FIG. 5C

LOW NOISE AMPLIFIERS WITH OUTPUT LIMITING

FIELD OF THE DISCLOSURE

Embodiments of the invention relate to electronic systems, and more particularly, to low noise amplifiers (LNAs).

BACKGROUND

A radio frequency (RF) communication system can include one or more low noise amplifiers (LNAs). For example, an LNA can be used in an RF communication system to amplify relatively weak signals received by an antenna. The LNA can operate to provide initial amplification in a receive path to increase signal-to-noise ratio (SNR) of the received signal by providing gain to the signal while introducing a relatively small amount of noise.

Examples of RF communication systems with one or more LNAs include, but are not limited to, base stations, mobile devices (for instance, smartphones or handsets), laptop computers, tablets, and wearable electronics.

SUMMARY OF THE DISCLOSURE

Low noise amplifiers (LNAs) with output limiting are provided herein. In certain configurations herein, an LNA is fabricated using a compound semiconductor fabrication technology, such as gallium nitride (GaN). The LNA includes an output limiter for limiting an amount of output power of the LNA. Thus, output signal power of the LNA is confined, which provides a number of benefits, including protection of downstream circuitry receiving the LNA's output signal. For example, such downstream circuitry can be fabricated using silicon or other fabrication technologies associated with a lower signal power handling capability relative to that of the LNA. In certain implementations, the output limiter is controllable to facilitate deployment of the LNA in a wide variety of applications and usage scenarios.

In one aspect, a radio frequency (RF) communication system with controllable downstream circuit protection is provided. The RF communication system includes an LNA configured to amplify an RF input signal to generate an RF output signal, and a downstream circuit configured to receive the RF output signal from the LNA. The LNA includes a controllable output limiter configured to limit the RF output signal from the LNA with a controllable amount of output limiting.

In another aspect, a GaN die with output limiting is provided. The GaN die includes an input pin configured to receive a low noise amplifier (LNA) input signal, an output pin configured to provide an LNA output signal, GaN amplification circuitry configured to amplify the LNA input signal to generate an LNA output signal, and an output limiter configured to provide output limiting to the LNA output signal to thereby limit a signal power at the output pin.

In another aspect, a method of RF communication is provided. The method includes selecting an amount of output limiting provided by a controllable output limiter of an LNA, amplifying an RF input signal to generate an RF output signal using the LNA, providing the RF output signal from the LNA to a downstream circuit, and protecting the downstream circuit from damage by limiting the RF output signal using the controllable output limiter.

BRIEF DESCRIPTION OF THE DRAWINGS

FIG. 4B is a schematic diagram of an LNA with an output limiter according to another embodiment.

FIG. 5A is a circuit diagram of another embodiment of an output limiter for an LNA.

FIG. 5B is a circuit diagram of another embodiment of an output limiter for an LNA.

FIG. 5C is a circuit diagram of another embodiment of an output limiter for an LNA.

DETAILED DESCRIPTION OF EMBODIMENTS

Figure 1:
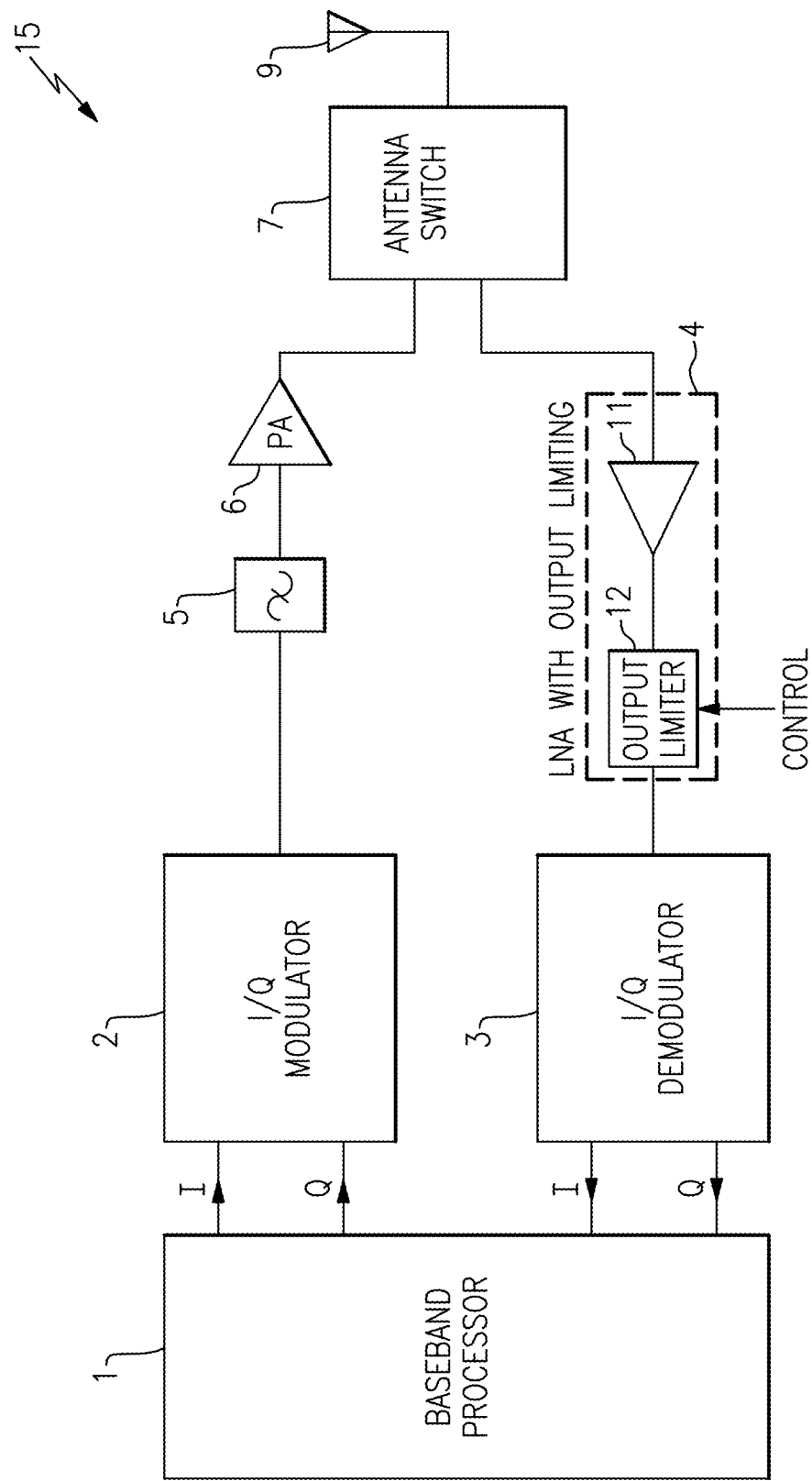
FIG. 1 is a schematic diagram of an RF communication system according to one embodiment.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. To provide amplification to a relatively weak RF signal received from an antenna, the RF communication system can include a low noise amplifier (LNA). The LNA can provide amplification to the RF signal while introducing a relatively small amount of noise, thereby enhancing signal-to-noise ratio (SNR) and allowing the RF communication system to receive signals at far distances, in noisy radio environments, and/or from relatively weak transmitters.

An LNA can be manufactured using a wide variety of fabrication technologies. One type of fabrication technology is gallium nitride (GaN), which is a compound semiconductor technology. In particular, GaN is a III-V semiconductor technology suitable for high power applications. For instance, an LNA fabricated using a GaN process can support up to about 100 times the signal output power relative to LNAs fabricated using other processing technologies, such as silicon or gallium arsenide (GaAs). In one example, a GaN LNA handles up to about 45 dBm of signal power before breakdown, while a GaAs LNA handles up to about 23 dBm of signal power before breakdown.

Although an LNA typically provides amplification to weak signals of low power, in some applications an LNA can receive a relatively strong input signal at certain instances. For example, the LNA may receive a blocker or jammer signal having a relatively large power. When an LNA is implemented using GaN technology supporting high output power, such strong input signals can result in the GaN LNA outputting a large output signal. Absent a protection mechanism, the large output signal can cause damage to circuitry downstream from the LNA.

Low noise amplifiers with output limiting are provided herein. In certain implementations, a GaN LNA includes LNA amplification circuitry and an output limiter that is connected to an output of the LNA amplification circuitry and operable to limit an output power of the GaN LNA. By limiting the output signal power, a number of benefits are achieved, including protection of downstream circuitry receiving the GaN LNA's output signal. For example, such downstream circuitry can be fabricated using silicon or other fabrication technology associated with a lower signal power handling capability relative to that of the GaN LNA.

Thus, the output limiter operates to limit output signal power from the GaN LNA to provide protection to circuitry that is downstream from the GaN LNA. In certain implementations, the output limiter is controllable (for instance, selectable and/or adjustable) to facilitate use of the GaN LNA in a wide variety of applications.

In certain implementations, the GaN LNA is implemented using at least one high electron mobility transistor (HEMT) fabricated using GaN processing technology. A HEMT can also be referred to as a modulation-doped field effect transistor (MODFET) or a heterojunction field effect transistor (HFET). In one embodiment, the GaN LNA includes at least one pseudomorphic high electron mobility transistor (pHEMT) that operates to provide amplification to the GaN LNA's input signal.

FIG. 1 is a schematic diagram of an RF communication system 15 according to one embodiment. The RF communication system 15 includes a baseband processor 1, an I/Q modulator 2, an I/Q demodulator 3, an LNA 4, a filter 5, a power amplifier 6, an antenna switch 7, and an antenna 9. As shown in FIG. 1, the LNA 4 is implemented with output limiting, and includes LNA amplification circuitry 11 and an output limiter 12.

Although, the RF communication system 15 illustrates one example of an electronic system that can include an LNA with output limiting, LNAs with output limiting can be used in a wide variety of electronic systems. Additionally, although a particular configuration of components is illustrated in FIG. 1, the RF communication system 15 can be adapted and modified in a wide variety of ways. For example, the RF communication system 15 can include more or fewer receive paths and/or transmit paths. Additionally, the RF communication system 15 can be modified to include more or fewer components and/or a different arrangement of components.

Furthermore, although FIG. 1 illustrates the amplified output signal of the LNA 4 being provided to the I/Q demodulator 3, the output signal of the LNA 4 can be provided to a wide variety of components and/or circuits, including, but not limited to, attenuators, amplifiers, filters, switches, resonators, duplexers, frequency multiplexers (for instance, diplexers or triplexers), and/or mixers.

As shown in FIG. 1, baseband processor 1 generates an in-phase (I) transmit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a sinusoidal wave or transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof used for processing the digital signals.

The I/Q modulator 2 receives the I and Q transmit signals from the baseband processor 1 and processes them to generate a modulated RF signal. In certain configurations, the I/Q modulator 2 can include DACs for converting the I and Q transmit signals into an analog format, mixers for upconverting the I and Q transmit signals to radio frequency, and a signal combiner for combining the upconverted I and Q signals into the modulated RF signal.

The I/Q demodulator 3 generates the I receive signal and the Q receive signal. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The filter 5 receives the modulated RF signal from the I/Q modulator 2, and provides a filtered RF signal to an input of the power amplifier 6. In certain configurations, the filter 5 can be a bandpass filter configured to provide band filtering. However, the filter 5 can be a low pass filter, a band pass filter, a notch filter, or a high pass filter, depending on the application.

The power amplifier 6 can amplify the filtered RF signal to generate an amplified RF signal, which is provided to the antenna switch 7. The antenna switch 7 is further electrically connected to the antenna 9 and to an input of the LNA 4. The antenna switch 7 can be used to selectively connect the antenna 9 to the output of the power amplifier 6 or to the input of the LNA 4.

Although FIG. 1 illustrates an example in which an input of the LNA 4 is connected to the antenna 9 by way of the antenna switch 7, other implementations are possible. For example, the input of the LNA 4 can be electrically connected to the antenna 9 by way of a wide variety of components, including, but not limited to, duplexers, frequency multiplexers (for instance, diplexers or triplexers), matching circuits, filters, and/or switches.

In the illustrated embodiment, the LNA 4 includes a cascade of LNA amplification circuitry 11 and the output limiter 12. The LNA amplification circuitry 11 can include any suitable number of stages, for example, 1 stage, 2 stages, or 3 or more stages.

In certain implementations, the LNA 4 is fabricated on a compound semiconductor die or chip, such as a GaN die. For example, the LNA 4 can include one or more HEMTs fabricated using GaN processing technology. In certain implementations, the LNA 4 includes at least one GaN pseudomorphic high electron mobility transistor (pHEMT) for providing signal amplification.

Thus, the LNA 4 can be fabricated on a GaN die, while one or more downstream components (for instance, all or part of the I/Q demodulator 3) can be fabricated on a die that is manufactured using a different processing technology, for instance, a different compound semiconductor process, such as GaAs, or a Si process such as complementary metal oxide semiconductor (CMOS) or silicon-on-insulator (SOI). The downstream circuitry can exhibit lower power handling capability relative to the LNA 4. Thus, the output limiter 12 operates to protect circuitry that is downstream of the LNA 4 in the receive path from damage.

In the illustrated embodiment, the output limiter 12 receives one or more control signals for controlling output limiting, such as selectively enabling the limiting and/or adjusting the amount of limiting provided by the output limiter 12. Thus, in this embodiment the output limiter 12 is a controllable output limiter. By implementing the output limiter 12 with controllability, flexibility can be increased. For example, by providing control over the output limiting of the LNA 4, the LNA 4 can be used in a wide variety of applications associated with different design constraints with respect to signal limiting and/or protection of downstream circuitry.

The LNA 4 can provide amplification to signals associated with a variety of communication standards, including, for example, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Moreover, the LNA 4 can provide amplification to signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Figure 2:
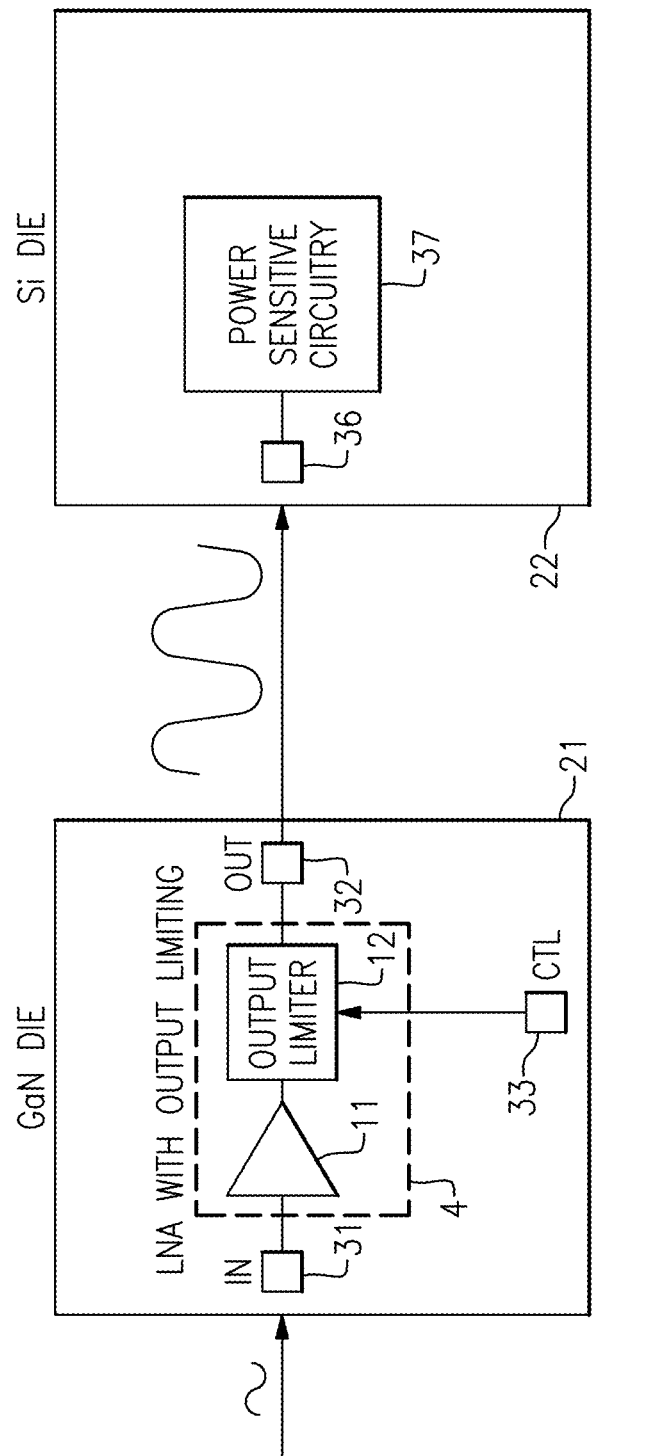
FIG. 2 is a schematic diagram of an arrangement of semiconductor dies for one embodiment of an RF communication system.

FIG. 2 is a schematic diagram of an arrangement of semiconductor dies for one embodiment of an RF communication system. As shown in FIG. 2, a GaN die 21 and a Si die 22 have been depicted. The GaN die 21 includes an LNA 4 that provides an output signal to the Si die 22 via an electrical connection, which can be include, for example, conductors of a package, multi-chip module, and/or circuit board.

In the illustrated embodiment, the LNA 4 includes LNA amplification circuitry 11 and an output limiter 12. Although the GaN die 21 is illustrated as including the LNA 4, the GaN die 21 can include additional circuitry. As shown in FIG. 2, the GaN die 21 includes an RF input pad or pin 31 (IN), an RF output pin 32 (OUT), and a control pin 33 (CTL). Although the GaN die 21 is illustrated with three pins, the GaN die 21 can include additional pins. Furthermore, in certain implementations, the control pin 33 is omitted.

As shown in FIG. 2, the LNA amplification circuitry 11 amplifies an input signal received at the RF input pin 31, and generates an output signal at the RF output pin 32. Additionally, the output limiter 33 provides output limiting to limit the power of the output signal. In certain implementations, additional circuitry, such as switches, is included between the input of the LNA 4 and the RF input pin 31 and/or between the output of the LNA 4 and the RF output pin 32.

With continuing reference to FIG. 2, the Si die 22 includes power sensitive circuitry 37 and an input pin 36 that receives the output signal from the GaN die 21. The power sensitive circuitry 37 can correspond to a wide variety of circuitry, including, but not limited to, an attenuator circuit, an amplifier circuit, a filter circuit, a switch circuit, a resonator circuit, and/or a mixer circuit. Although an example with one signal pin is shown, the Si die 22 can include additional pins and/or circuitry. Furthermore, although an example with a downstream Si die is shown, a wide variety of types of dies can include downstream circuitry that is sensitive to LNA output signals of high power.

Absent inclusion of the output limiter 12, the power sensitive circuitry 37 of the Si die 22 can become damaged from high power signals outputted from the LNA 4 of the GaN die 21. For example, high power signals can lead to damage of the power sensitive circuitry 37 due to overvoltage conditions, such as voltage levels greater than the maximum allowable voltages for silicon transistors. Furthermore, high power signals can increase die temperature and lead to gate oxide punch-through, junction damage, metal damage and/or surface charge accumulation. Moreover, high power signals can induce latch-up, thereby disrupting the functioning of the chip and potentially causing permanent damage.

Accordingly, the output limiter 12 operates to limit output power of the LNA 4 to thereby protect downstream circuits, such as the power sensitive circuitry 37 from damage.

Implementing the LNA 4 with the output limiter 12 provides superior performance relative to an implementation using only an input signal limiter. For example, an input signal limiter can provide insufficient power reduction such that the LNA output signal may nevertheless have high output power and cause damage to downstream circuitry. Furthermore, variation in the LNA's supply voltage and/or bias current can make it difficult to select a suitable amount of input signal limiting to ensure that the output power does not reach a level that can cause damage.

In certain implementations herein, an LNA is implemented not only with an output limiter, but also with an input limiter and/or an inter-stage signal limiter to thereby further enhance output signal limiting. An inter-stage signal limiter refers to a signal limiter placed between amplification stages of an LNA in implementations in which the LNA includes two or more stages in cascade.

Figure 3:
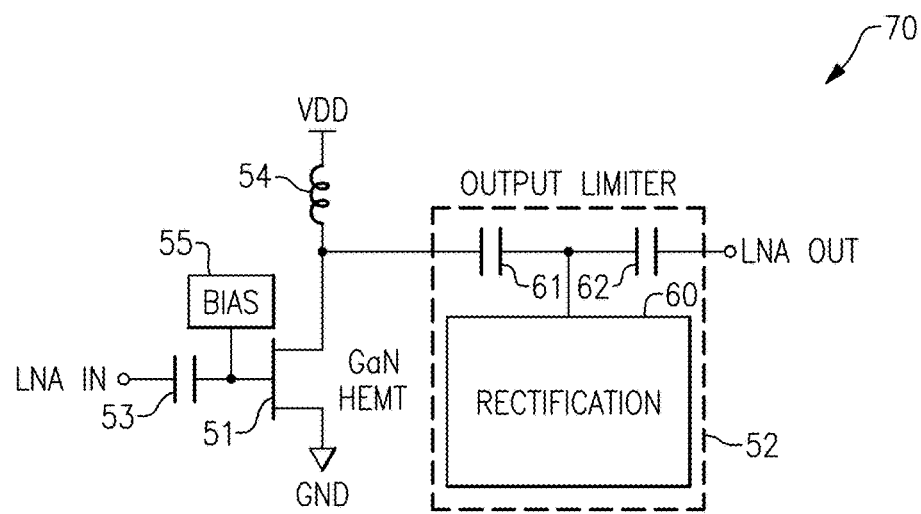
FIG. 3 is a schematic diagram of an LNA with an output limiter according to one embodiment.

FIG. 3 is a schematic diagram of an LNA 70 with an output limiter according to one embodiment. The LNA 70 includes a GaN HEMT 51, an output limiter 52, an input DC blocking capacitor 53, a supply inductor 54, and a bias circuit 55. The output limiter 52 includes a rectification circuit 60, a first DC blocking capacitor 61, and a second DC blocking capacitor 62. Although one embodiment of an LNA 70 with output limiting is shown, the teachings herein are applicable to LNAs implemented in a wide variety of ways.

Thus, although one specific implementation of the LNA 70 is shown, the LNA 70 can be modified or adapted in a wide variety of ways. In one example, the LNA 70 further includes degeneration, such as inductive and/or resistive denegation. In a second example, the LNA includes one or more additional amplification stages. In a third example, the LNA 70 is implemented with input and/or output matching circuits for providing termination. In a fourth example, the LNA further include a cascode transistor in series with the GaN HEMT 51. In a fifth example, the LNA further includes an input limiter. Although various example LNAs have been described, the teachings herein are applicable to LNAs implemented in a wide variety of ways.

The GaN HEMT 51 operates to provide amplification to an RF signal received from an LNA input terminal (LNA IN) via the input DC blocking capacitor 53. Additionally, the GaN provides an amplified RF signal to the LNA output terminal (LNA OUT) via the DC blocking capacitors of the output limiter 52. Although an embodiment with input and output DC blocking capacitors are shown, the teachings herein are also applicable to implementations without DC blocking capacitors. For example, certain RF communication systems operate with externally controlled DC biasing.

As shown in FIG. 3, the supply inductor 54 provides a power supply voltage VDD to a drain of the GaN HEMT 51. Additionally, a source of the GaN HEMT 51 receives a ground voltage GND. Furthermore, the bias circuit 55 controls a gate bias voltage of the GaN HEMT 51. In certain implementations, the bias circuit 55 receives a bias reference signal, such as a voltage and/or current to aid in controlling the gate bias voltage of the GaN HEMT 51 to a suitable voltage level.

The rectification circuit 60 is electrically connected in shunt to an output signal path of the LNA 70. In certain implementations, the rectification circuit 60 operates to rectify or limit output voltage swing of the LNA 70 relative to one or more reference voltages. For example, rectification circuit 60 can be implemented to limit the LNA's output signal when the voltage level is too high and/or too low as compared to the one or more reference voltages. In certain implementations, the one or more reference voltages for limiting include ground, a power supply voltage, and/or another suitable reference voltage.

An output limiter that limits only high voltage excursion or only low voltage excursion is referred to herein as a unidirectional output limiter. In contrast, an output limiter that limits both high voltage excursion and low voltage excursion is referred to herein as a bidirectional output limiter. The teachings herein are applicable to unidirectional output limiters as wells as to bidirectional output limiters.

The rectification circuit 52 can be implemented in a wide variety of ways. In certain configurations, the rectification circuit 52 includes at least one diode connected between the output signal path of the LNA and a reference voltage, such as ground or a power supply voltage. In certain implementations, two or more diodes are connected in series to provide rectification of the LNA's output signal relative to the reference voltage. For example, increasing a number of diodes in series can control a trigger voltage at which the rectification circuit 60 provides rectification.

Figure 4A:
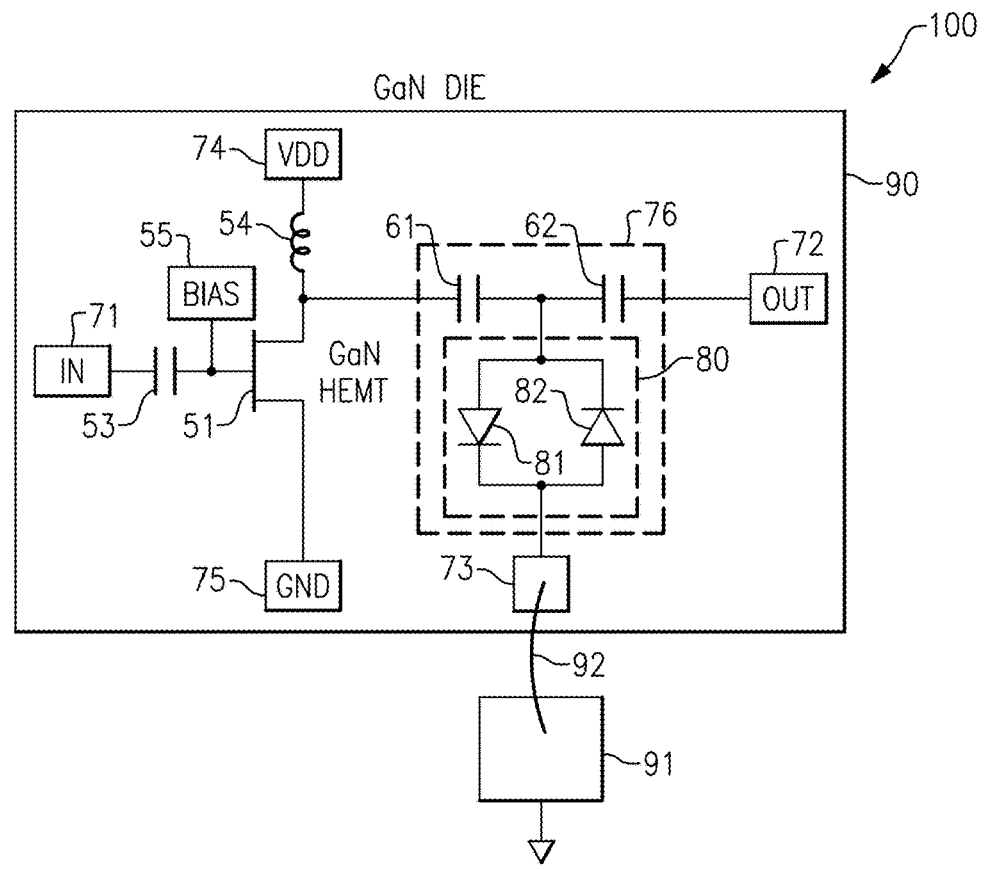
FIG. 4A is a schematic diagram of an LNA with an output limiter according to another embodiment.

FIG. 4A is a schematic diagram of an LNA 100 with an output limiter according to another embodiment. The LNA 100 is fabricated on a GaN die 90 including a GaN HEMT 51, an input DC blocking capacitor 53, a supply inductor 54, a bias circuit 55, an input pad or pin 71 (IN), an output pin 72 (OUT), a control pin 73, a supply voltage pin 74 (VDD), a ground pin 75 (GND), and an output limiter 76.

The GaN die 90 includes an active side including transistors, diodes, and other circuit components fabricated thereon, and a back side opposite to the active side. In certain implementations, the pins of the GaN die 90 are fabricated using metallization on the active side of the GaN die 90. However, other configurations are possible. In one example, the ground pin 75 is implemented using metallization on the back side of the GaN die 90, and one or more through substrate vias (TSVs) are used to provide electrical connections between circuitry on the active side and the ground pin 75. In certain implementations, the GaN die 90 includes a GaN layer formed over an isolation layer (for instance, aluminum nitride), which in turn is formed over a carrier substrate, such as a silicon carrier substrate or a silicon carbide (SiC) carrier substrate.

As shown in FIG. 4A, the output limiter 76 includes a rectification circuit 80, a first DC blocking capacitor 61, and a second DC blocking capacitor 62. The first DC blocking capacitor 61 and the second DC blocking capacitor 62 can be implemented in a wide variety of ways, including, but not limited to, using metal-insulator-metal (MIM) capacitor structures and/or other capacitor structures readily available in a GaN process. In certain implementations, the first DC blocking capacitor 61 and/or the second DC blocking capacitor 62 are omitted.

The rectification circuit 80 includes a first diode 81 and a second diode 82, which are connected in anti-parallel with one another between the LNA's output signal path and the control pin 73. For example, the first diode 81 includes an anode connected to the LNA's output signal path and a cathode connected to the control pin 73. Additionally, the second diode 82 includes an anode connected to the control pin 73 and a cathode connected to the LNA's output signal path.

In certain implementations, one or more additional diodes can be included in series with the first diode 81 and/or the second diode 82 to aid in tuning trigger voltages at which the rectification circuit 80 provides rectification. In such implementations, the number of additional diodes included in series with the first diode 81 and/or the second diode 82 need not be the same. The diodes can be implemented in a wide variety of ways including, but not limited to, using Schottky diodes and/or other diodes readily available in a GaN process. Although an example in which output limiting is provided by diodes, output limiting can be provided in other ways.

Although one example of an LNA 100 is shown, the teachings herein are applicable to LNA's implemented in a wide variety of ways, including, but not limited to, different implementations of LNA amplification circuitry and/or output limiting.

As shown in FIG. 4A, the control pad 73 is configured to receive a wire bond 92 (which can be any suitable conductor, such as a wire or ribbon) to thereby electrically connect the control pad 73 to a conductor 91 that is external to the GaN die 90. The external conductor 90 can be controlled to a suitable reference voltage, such as ground.

When the wire bond 92 is present, the rectification circuit 80 operates to provide output signal limiting to the LNA 100. However, when the wire bond 92 is omitted, the rectification circuit 80 provides substantially no limiting. Thus, in the embodiment of FIG. 4A, the output limiter 76 can be selectively activated or deactivated based on whether or not the wire bond 92 is included.

Certain output limiters herein are selectable by a user (for instance, a downstream manufacturer incorporating the LNA into a larger electronic system or product) of the LNA to thereby provide flexibility to use the LNA in a wide variety of applications, including those in which output limiting is desired and those in which output limiting is not desired. Although an example in which selection of output limiting is provided by a wire bond, other implementations are possible, such as implementations in which output limiting is selected by controlling a pin voltage of a die, by blowing a fuse, by programming data over an interface (for instance, a serial interface such as a MIPI RFFE bus), and/or any other suitable control mechanism.

Accordingly, certain output limiters herein are implemented with controllability. An output limiter that can be selectively enabled is an example of one type of controllability. However, the output limiters herein can be controlled in other ways, including, but not limited to having an amount of output attenuation (for limiting high signal excursion and/or low signal excursion) that is controllable. Such control of output attenuation for an LNA output limiter can be implemented in a wide variety of ways, including, but not limited to, digital programmability and/or analog tuning.

FIG. 4B is a schematic diagram of an LNA 100' with an output limiter according to another embodiment. The LNA 100' of FIG. 4B is similar to the LNA 100 of FIG. 4A, except that the control pin 73 is omitted in favor of connecting the output limiter 76 between the LNA's output signal path and the ground pin 75. Thus, the output limiter 76 of the LNA 100' is not controllable, in this embodiment.

FIG. 5A is a circuit diagram of another embodiment of an output limiter 110 for an LNA. The output limiter 110 includes a first DC blocking capacitor 61 and a second DC blocking capacitor 62 in series along an output signal path of an LNA. Additionally, the output limiter 110 includes a first diode 81, a second diode 82, a FET switch 105, and a biasing resistor 101.

The FET switch 105 can be turned on off or off to selectively activate the output limiter 110. In certain implementations, the FET switch 105 is a depletion-mode FET that operates using a ground voltage (for instance, 0 V) for ON operation and a negative voltage (for instance, −5 V) for OFF operation.

FIG. 5B is a circuit diagram of another embodiment of an output limiter 120 for an LNA. The output limiter 120 includes a first DC blocking capacitor 61 and a second DC blocking capacitor 62 in series along an output signal path of an LNA. Additionally, the output limiter 110 includes a first diode 81, a second diode 82, a FET switch 105, a first biasing resistor 111, a second biasing resistor 112, a third biasing resistor 113, and a third DC blocking capacitor 63.

The FET switch 105 can be turned on off or off to selectively activate the output limiter 120. In certain implementations, the FET switch 105 is a depletion-mode FET that operates using supply voltage (for instance, +5 V) and a ground voltage (for instance, 0 V) for OFF operation.

As shown by a comparison of FIGS. 5A and 5B, switches for selectively activating an output limiter can operate using a wide variety of control, including, for example, positive voltage control or negative voltage control.

FIG. 5C is a circuit diagram of another embodiment of an output limiter 130 for an LNA. The output limiter 130 of FIG. 5C is similar to the output limiter 110 of FIG. 5A, except that the output limiter 130 includes an additional diode 81' in series with the diode 81, and an additional diode 82' in series with the diode 82.

Including two or more diodes in series can aid in controlling a trigger voltage at which an output limiter provides limiting. The diodes 81 and 81' control a high trigger voltage at which rectification is provided in response to high voltage excursions of the LNA output signal, while the diodes 82 and 82' control a low trigger voltage at which rectification is provided for low voltage excursions of the LNA output signal. Although an example in which an equal number of diodes are used for rectifying high voltage and low voltage excursions, a different number of diodes can be used, for instance, in applications in which asymmetric rectification characteristics are desired.

Figure 6A:
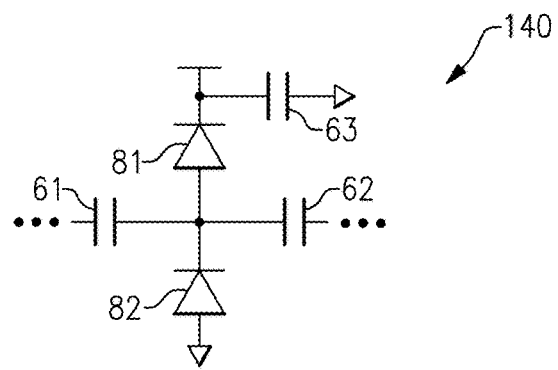
FIG. 6A is a circuit diagram of another embodiment of an output limiter for an LNA.

FIG. 6A is a circuit diagram of another embodiment of an output limiter 140 for an LNA. The output limiter 140 includes a first DC blocking capacitor 61 and a second DC blocking capacitor 62 in series along an output signal path of an LNA. Additionally, the output limiter 140 includes a first diode 81, a second diode 82, and a third DC blocking capacitor 63.

In the illustrated embodiment, the first diode 81 includes an anode electrically connected to the output signal path and a cathode electrically connected to a first reference voltage, which can be, for example, a power supply voltage. As shown in FIG. 6A, the third DC blocking capacitor 63 is electrically connected between the cathode of the first diode 81 and a second reference voltage, which can be, for example, ground. Additionally, the second diode 82 includes an anode electrically connected to the second reference voltage and a cathode electrically connected to the output signal path.

Figure 6B:
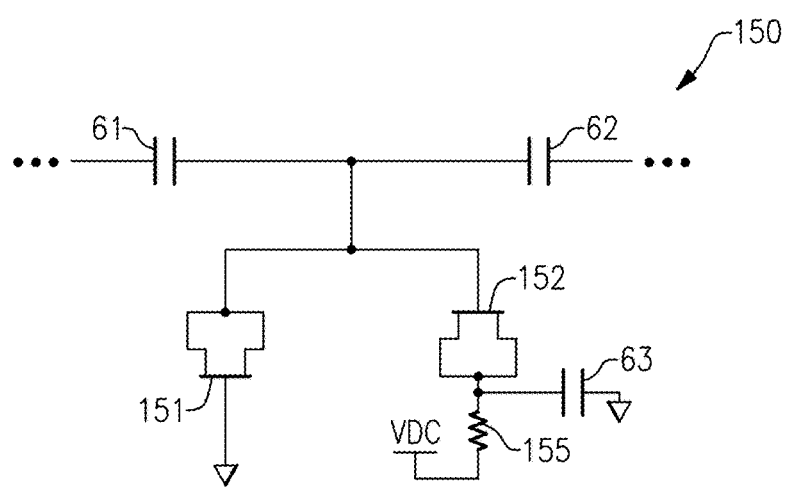
FIG. 6B is a circuit diagram of another embodiment of an output limiter for an LNA.

FIG. 6B is a circuit diagram of another embodiment of an output limiter 150 for an LNA. The output limiter 150 includes a first DC blocking capacitor 61 and a second DC blocking capacitor 62 in series along an output signal path of an LNA. Additionally, the output limiter 150 includes a first HEMT 151, a second HEMT 152, a third DC blocking capacitor 63, and a resistor 155.

The first HEMT 151 includes a source and drain electrically connected to one another to operate as a cathode of a Schottky diode, and a gate that operates as an anode of the Schottky diode. For example, the first HEMT 151 includes a metal gate over a semiconductor region, and the metal-semiconductor junction operates as a Schottky barrier. Likewise, the second HEMT 152 includes a source and drain electrically connected to one another to operate as a cathode of a Schottky diode, and a gate that operates as an anode of the Schottky diode. The first HEMT 151 and the second HEMT 152 are also referred to herein as Schottky gate diodes.

In certain implementations herein, an output limiter for an LNA includes one or more HEMTs connected to operate as Schottky diodes that provide rectification. For example, any of the diodes shown in FIGS. 4A-6D can be implemented using Schottky gate diodes. However, the LNA output limiters herein can include diodes implemented in other ways.

The resistor 155 is connected between the source/drain of the second HEMT 152 and a DC voltage $V_{DC}$, which is controllable. For instance, a DAC or other suitable means can be used to control the voltage level of the DC voltage $V_{DC}$. In certain implementations, the DC voltage $V_{DC}$ is received at a pin of a semiconductor die.

The amount of rectification provided by the second HEMT 152 varies based on voltage level of the DC voltage $V_{DC}$. Since the second HEMT 152 provides limiting to high voltage excursions of the LNA output signal, the output limiter 150 has an adjustable amount of high voltage limiting. In the illustrated embodiment, the voltage level of the DC voltage $V_{DC}$ controls the amount of limiting provided. However, other implementations are possible.

Figure 6C:
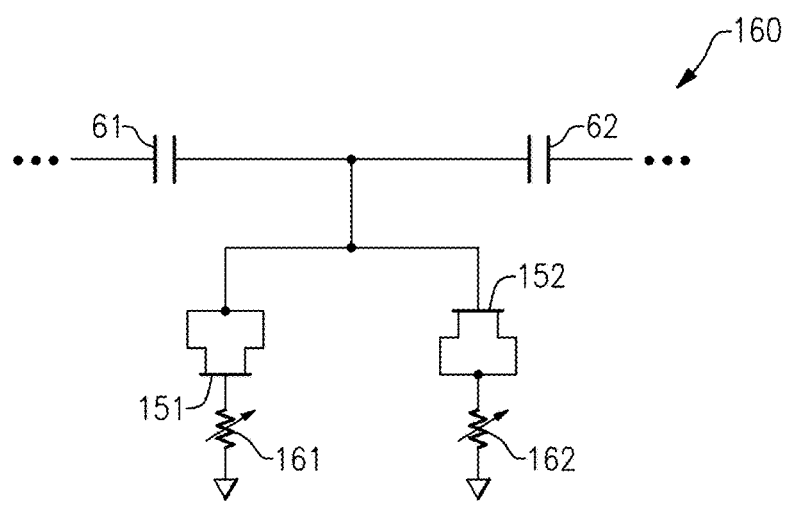
FIG. 6C is a circuit diagram of another embodiment of an output limiter for an LNA.

FIG. 6C is a circuit diagram of another embodiment of an output limiter 160 for an LNA. The output limiter 160 includes a first DC blocking capacitor 61 and a second DC blocking capacitor 62 in series along an output signal path of an LNA. Additionally, the output limiter 160 includes a first HEMT 151, a second HEMT 152, a first controllable resistor 161, and a second controllable resistor 162.

In the illustrated embodiment, the first HEMT 151 operates as a first Schottky diode that provides low voltage limiting (when the LNA output signal has an excessively low voltage level), and the second HEMT 152 operates as a second Schottky diode that provides high voltage limiting (when the LNA output signal has an excessively high voltage level). Additionally, the first controllable resistor 161 controls an amount of low voltage limiting provided by the output limiter 160, and the second controllable resistor 162 controls an amount of high voltage limiting provided by the output limiter 160.

The controllable resistors can be implemented in a wide variety of ways, including, but not limited to, using analog tuned resistors and/or digitally programmable resistors. In one example, a digitally programmable resistor includes a plurality of parallel circuit branches or paths each including a resistive element and a switch, and the state of the switches can be selected to control an overall resistance of the digitally programmable resistor.

Figure 6D:
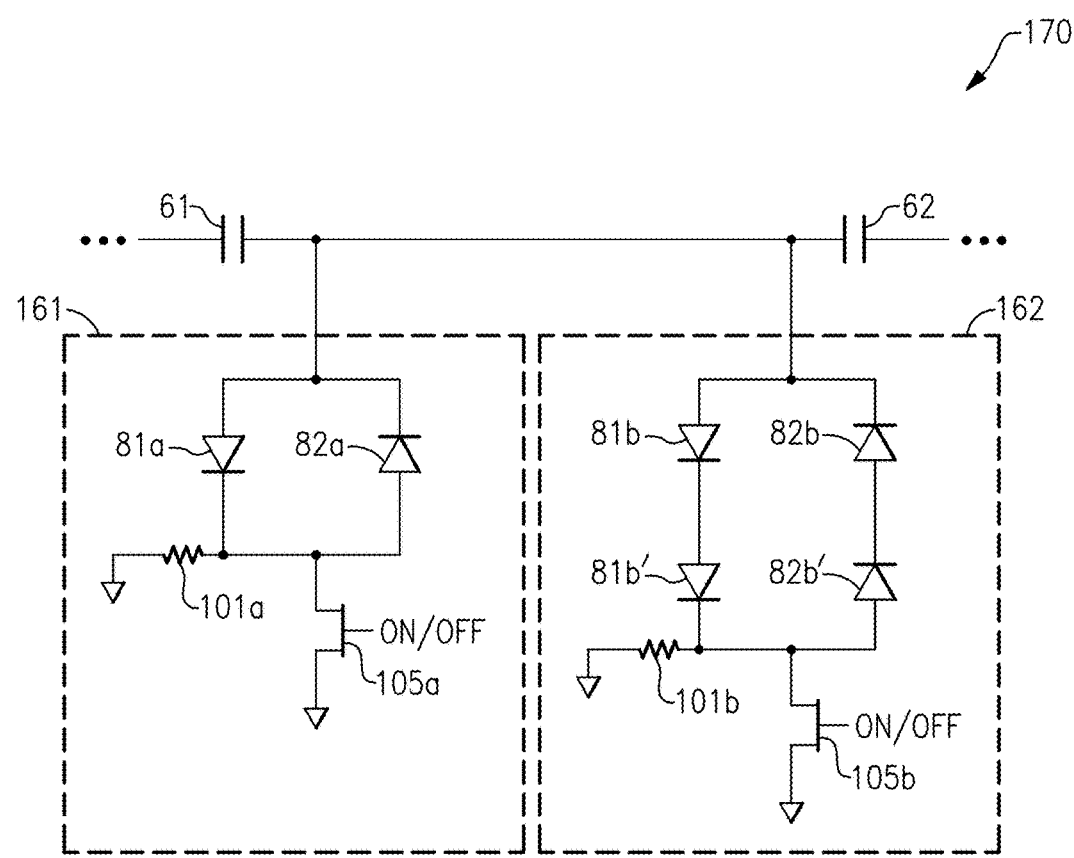
FIG. 6D is a circuit diagram of another embodiment of an output limiter for an LNA.

FIG. 6D is a circuit diagram of another embodiment of an output limiter 170 for an LNA. The output limiter 170 includes a first output limiter section 161, which includes a first diode 81a, a second diode 82a, a resistor 101a, and a FET switch 105a. The output limiter 170 further includes a second output limiter section 162, which includes a first pair of series diodes 81b/81b', a second pair of series diodes 82b/82b', a resistor 101b, and a FET switch 105b.

The first output limiter section 161 is similar to the output limiter 110 of FIG. 5A, and the second output limiter section 162 is similar to the output limiter 130 of FIG. 5C. By selectively activating a desired output limiter section using the FET switches, a desired amount of power limiting can be achieved. For instance, in this example, output limiting associated with one diode or output limiting associated with two series diodes is selectable. Although two examples of output limiting sections have been shown, output limiting sections can be implemented in a wide variety of ways. Furthermore, although an example with two output limiting sections is shown, an LNA output limiter can include three or more output limiting sections.

Figure 7A:
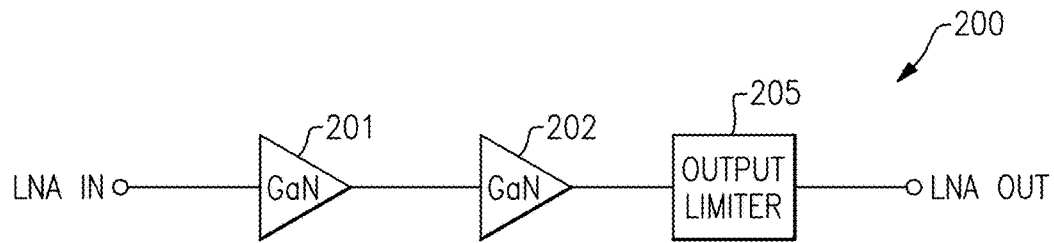
FIG. 7A is a schematic diagram of another embodiment of an LNA.

FIG. 7A is a schematic diagram of another embodiment of an LNA 200. The LNA 200 includes a GaN input amplification stage 201, a GaN output amplification stage 202, and an output limiter 205. As shown in FIG. 7A, the GaN input amplification stage 201, the GaN output amplification stage 202, and the output limiter 205 are electrically connected in a cascade between an input (LNA IN) and an output (LNA OUT).

The LNA 200 of FIG. 7A illustrates one embodiment of a multi-stage LNA with output limiting. In certain implementations, the output limiter 205 is controllable (for instance, selectable and/or adjustable).

Figure 7B:
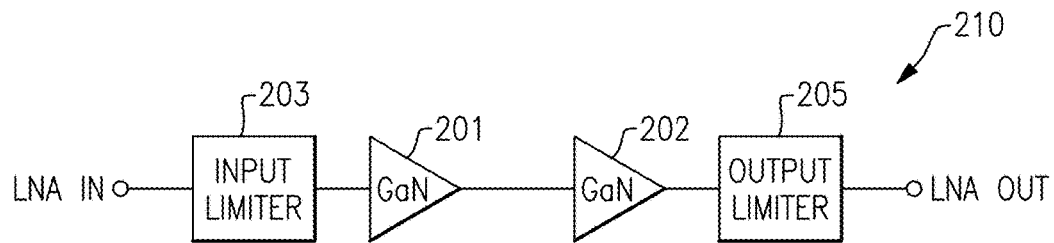
FIG. 7B is a schematic diagram of another embodiment of an LNA.

FIG. 7B is a schematic diagram of another embodiment of an LNA 210. The LNA 210 includes a GaN input amplification stage 201, a GaN output amplification stage 202, an input limiter 203, and an output limiter 205. As shown in FIG. 7B, the input limiter 203, the GaN input amplification stage 201, the GaN output amplification stage 202, and the output limiter 205 are electrically connected in a cascade between an input (LNA IN) and an output (LNA OUT).

Including both LNA output limiter 205 and the LNA input limiter 203 can provide further control or enhancement over limiting the output power of the LNA 210. In certain implementations, the input limiter 203 and/or the output limiter 205 are controllable (for instance, selectable and/or adjustable).

Although the LNA input limiter 203 is illustrated in the context of a multi-stage LNA, the LNA input limiter 203 can also be included at the input of a single stage LNA. Any of the LNAs disclosed herein can also be implemented to include an LNA input limiter.

Figure 7C:
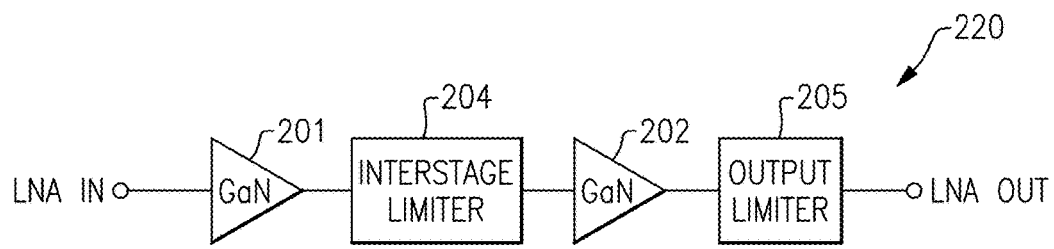
FIG. 7C is a schematic diagram of another embodiment of an LNA.

FIG. 7C is a schematic diagram of another embodiment of an LNA 220. The LNA 220 includes a GaN input amplification stage 201, a GaN output amplification stage 202, an interstage limiter 204, and an output limiter 205. As shown in FIG. 7C, the GaN input amplification stage 201, the interstage limiter 204, the GaN output amplification stage 202, and the output limiter 205 are electrically connected in a cascade between an input (LNA IN) and an output (LNA OUT).

By including the interstage limiter 204 in addition to the output limiter 205, a further enhancement of output signal limiting can be achieved. In certain implementations, the interstage limiter 204 and/or the output limiter 205 are controllable (for instance, selectable and/or adjustable).

Figure 7D:
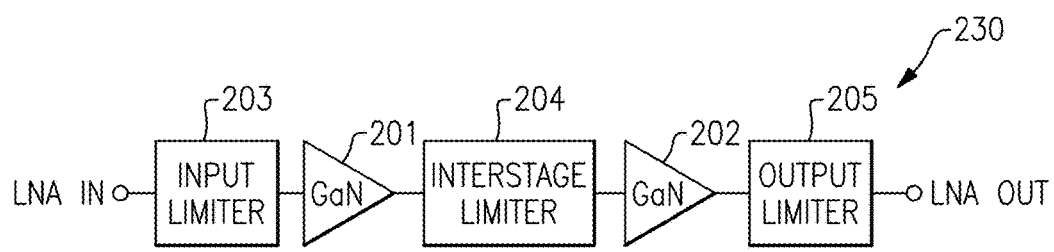
FIG. 7D is a schematic diagram of another embodiment of an LNA.

FIG. 7D is a schematic diagram of another embodiment of an LNA 230. The LNA 230 includes a GaN input amplification stage 201, a GaN output amplification stage 202, an input limiter 203, an interstage limiter 204, and an output limiter 205. As shown in FIG. 7D, the input limiter 203, the GaN input amplification stage 201, the interstage limiter 204, the GaN output amplification stage 202, and the output limiter 205 are electrically connected in a cascade between an input (LNA IN) and an output (LNA OUT).

Including the input limiter 203 and the interstage limiter 204 in combination with the output limiter 205 can provide an even further degree of control over output power limiting. In certain implementations, the input limiter 203, the interstage limiter 204, and/or the output limiter 205 are controllable (for instance, selectable and/or adjustable).

Moreover, including the input limiter 203 and/or the interstage limiter 204 can aid in speeding up the recovery time of the LNA 230 (for example, the recovery time of the GaN input amplification stage 201 and/or the GaN output amplification stage 202) after a large input signal causes the LNA 230 to operate in compression or deep compression.

For example, a GaN die can include a relatively large number of interface traps with long emission time constants. The interface traps can be present along an interface or border between a GaN semiconductor layer and a material over which the GaN semiconductor layer is formed. Additionally, the long emission time constants of the traps result in the GaN LNA taking a relatively long time to recover after operating in deep compression, for instance, up to about a few seconds of recovery time. Such long recovery times can be unacceptable in certain mission critical applications, such as aeronautic, automotive, and/or military applications in which temporary inoperability of the LNA can pose a risk to human life.

By including an input limiter and/or an interstage limiter, an LNA can be inhibited from entering deep compression, and thus operate with lower recovery time.

Figure 8:
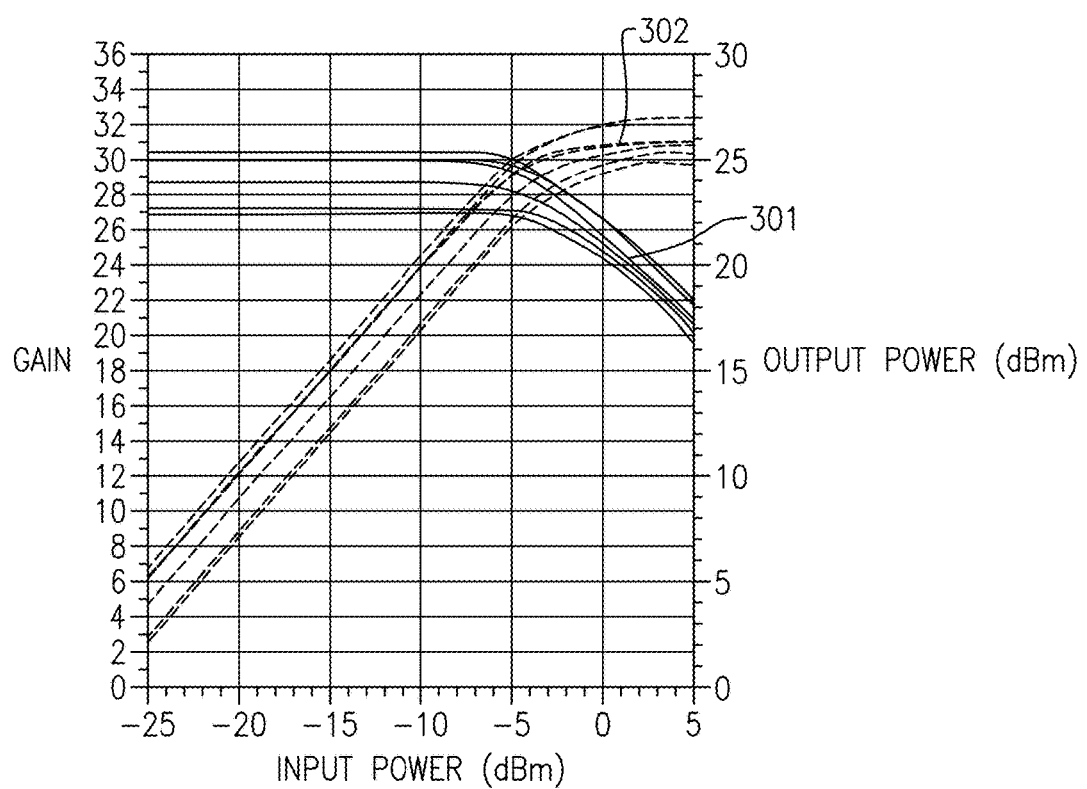
FIG. 8 is a graph of one example of gain and RF output power versus RF input power for an LNA.

FIG. 8 is a graph of one example of gain and RF output power versus RF input power for an LNA. The graph includes a group of plots 301 of gain versus RF input power and a group of plots 302 of RF output power vs RF input power. The graph corresponds to simulation results for one implementation of a GaN LNA without output limiting. The different plots within each group corresponding to results for different signal frequencies between 6 GHz to 18 GHz.

As shown in FIG. 8, the GaN LNA can output a relatively large output power when no output limiter is present, for instance, up to about 27 dBm in this example.

Figure 9:
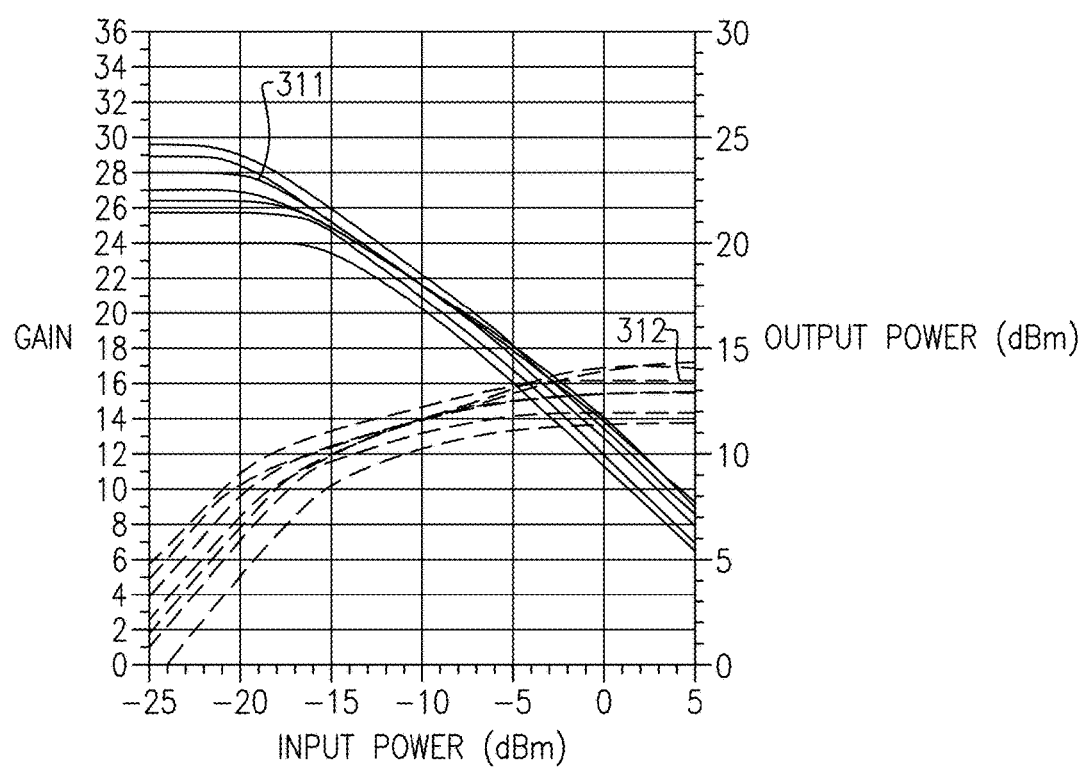
FIG. 9 is a graph of another example of gain and RF output power versus RF input power for an LNA.

FIG. 9 is a graph of another example of gain and RF output power versus RF input power for an LNA. The graph includes a group of plots 311 of gain versus RF input power and a group of plots 312 of RF output power vs RF input power. The graph corresponds to simulation results for one implementation of a GaN LNA with an output limiter implemented using diodes. The different plots within each group corresponding to results for different signal frequencies between 6 GHz to 18 GHz.

As shown by a comparison of FIG. 8 to FIG. 9, including the output limiter operates to limit output power (to about 14 dBm, in this example).

Figure 10:
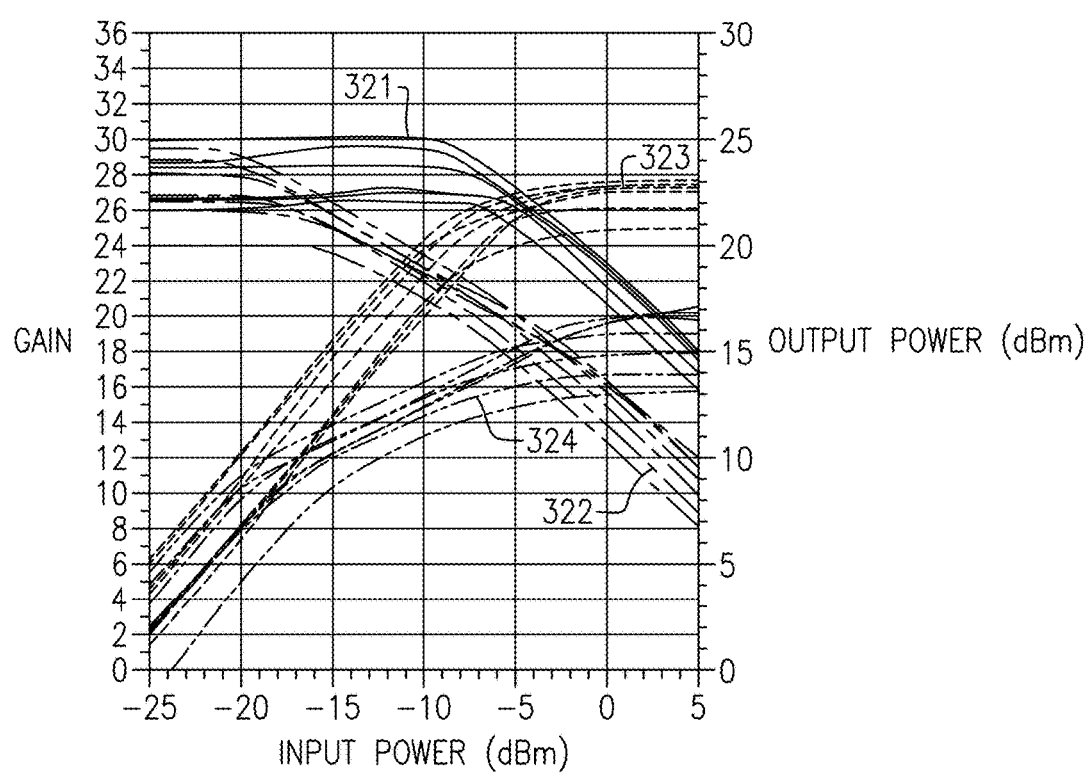
FIG. 10 is a graph of another example of gain and RF output power versus RF input power for an LNA.

FIG. 10 is a graph of another example of gain and RF output power versus RF input power for an LNA. The graph includes a first group of plots 321 of gain versus RF input power, a second group of plots 322 of gain versus RF input power, a first group of plots 323 of RF output power vs RF input power, and a second group of plots 324 of RF output power vs RF input power. The graph corresponds to simulation results for one implementation of a GaN LNA using the output limiter of FIG. 6B. The different plots within each group corresponding to results for different signal frequencies between 6 GHz to 18 GHz. The plots 321 and 323 correspond to simulations with the DC voltage $V_{DC}$ equal to about 5V and the plots 322 and 324 correspond to simulations with the DC voltage $V_{DC}$ equal to about 0V.

As shown in FIG. 10, the voltage level of the DC voltage $V_{DC}$ can be controlled to control the amount of output limiting. The DC voltage $V_{DC}$ can be controlled in discrete steps or using analog control.

Figure 11:
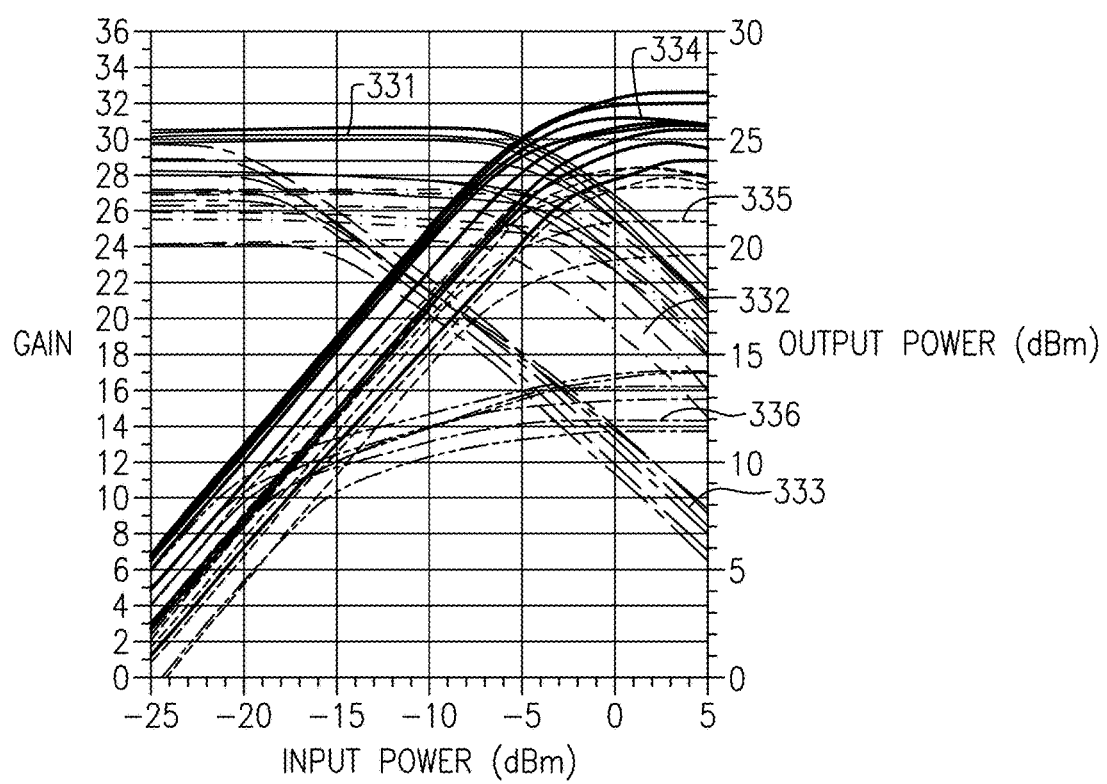
FIG. 11 is a graph of another example of gain and RF output power versus RF input power for an LNA.

FIG. 11 is a graph of another example of gain and RF output power versus RF input power for an LNA. The graph includes a first group of plots 331 of gain versus RF input power, a second group of plots 332 of gain versus RF input power, a third group of plots 333 of gain versus RF input power, a first group of plots 334 of RF output power vs RF input power, a second group of plots 335 of RF output power vs RF input power, and a third group of plots 336 of RF output power vs RF input power. The graph corresponds to simulation results for one implementation of a GaN LNA using the output limiter of FIG. 6C. The different plots within each group corresponding to results for different signal frequencies between 6 GHz to 18 GHz. The plots 331 and 334 correspond to simulations with the controllable resistors providing 5000Ω, the plots 332 and 335 correspond to simulations with the controllable resistors providing 50Ω, and the plots 333 and 336 correspond to simulations with the controllable resistors providing 0Ω.

As shown in FIG. 11, the resistance of the controllable resistors can be controlled to achieve a desired amount of output limiting.

Although various simulation results have been provided above, simulation results can differ based on a wide variety of factors, such as circuit implementation, simulation models, simulation parameters, and/or simulation tools. Accordingly, other simulation results are possible.

Applications

Devices employing the above described schemes can be implemented into various electronic devices. Examples of electronic devices include, but are not limited to, RF communication systems, consumer electronic products, electronic test equipment, communication infrastructure, etc. For instance, an LNA with output limiting can be used in a wide range of RF communication systems, including, but not limited to, base stations, mobile devices (for instance, smartphones or handsets), laptop computers, tablets, and wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) communication system with controllable downstream circuit protection, the RF communication system comprising:
   a low noise amplifier (LNA) configured to amplify an RF input signal to generate an RF output signal; and
   a downstream circuit configured to receive the RF output signal from the LNA,
   wherein the LNA comprises a controllable output limiter configured to limit the RF output signal from the LNA with a controllable amount of output limiting; and
   wherein the controllable output limiter comprises one or more diodes configured to provide rectification to the RF output signal.

2. The RF communication system of claim 1, wherein the controllable output limiter is configured for selective activation or deactivation by a switch.

3. The RF communication system of claim 1, wherein the controllable output limiter comprises two or more selectable output limiting sections providing different amounts of output limiting.

4. The RF communication system of claim 1, wherein the controllable output limiter comprises at least one resistor having a controllable resistance, wherein the controllable amount of output limiting is based on a resistance provided by the controllable resistance.

5. The RF communication system of claim 1, wherein at least one diode of the one or more diodes is implemented by a high electron mobility transistors (HEMT) connected to operate as a Schottky diode.

6. The RF communication system of claim 1, further comprising a gallium nitride (GaN) die, wherein the LNA is fabricated on the GaN die, and wherein the downstream circuit is fabricated on a second die of a different processing technology than the GaN die.

7. The RF communication system of claim 6, wherein the downstream die has lower power handling capability in comparison to the GaN die, and wherein the downstream die comprises: a silicon (Si) compound die, a silicon-on-insulator (SOI) die, or a gallium arsenide (GaAs) die.

8. A radio frequency (RF) communication system with controllable downstream circuit protection, the RF communication system comprising:
    a low noise amplifier (LNA) configured to amplify an RF input signal to generate an RF output signal; and
    a downstream circuit configured to receive the RF output signal from the LNA,
    wherein the LNA comprises a controllable output limiter configured to limit the RF output signal from the LNA with a controllable amount of output limiting, and
    wherein the controllable output limiter is configured for selective activation or deactivation by a wire bond.

9. A radio frequency (RF) communication system with controllable downstream circuit protection, the RF communication system comprising:
    a low noise amplifier (LNA) configured to amplify an RF input signal to generate an RF output signal; and
    a downstream circuit configured to receive the RF output signal from the LNA,
    wherein the LNA comprises a controllable output limiter configured to limit the RF output signal from the LNA with a controllable amount of output limiting; and
    wherein the controllable amount of output limiting is controllable based on voltage level of a DC input voltage.

10. A gallium nitride (GaN) die with output limiting, the GaN die comprising:
    an input pin configured to receive a low noise amplifier (LNA) input signal;
    an output pin configured to provide an LNA output signal;
    GaN amplification circuitry configured to amplify the LNA input signal to generate the LNA output signal; and
    an output limiter configured to provide output limiting to the LNA output signal to thereby limit a signal power at the output pin, the output limiter comprising one or more diodes configured to provide rectification to the LNA output signal.

11. The GaN die of claim 10, further comprising a control pin, wherein the output limiter is configured for selective activation or deactivation by presence of a wire bond at the control pin.

12. The GaN die of claim 10, wherein the output limiter comprises a switch configured to selective activate or deactivate the output limiter.

13. The GaN die of claim 10, wherein the output limiter comprises two or more selectable output limiting sections providing different amounts of output limiting.

14. The GaN die of claim 10, wherein the output limiter comprises at least one resistor having a controllable resistance, wherein an amount of output limiting provided by the output limiter is based on a resistance provided by the controllable resistance.

15. The GaN die of claim 10 wherein at least one diode of the one or more diodes is implemented by a high electron mobility transistors (HEMT) connected to operate as a Schottky diode.

16. The GaN die of claim 10, wherein the GaN amplification circuitry comprises a first amplification stage and a second amplification stage in cascade, wherein the GaN die further comprises at least one of an input limiter at an input of the first amplification stage or an interstage limiter at an output of the first amplification stage.

17. The GaN die of claim 10, further comprising an input limiter configured to provide input limiting to the GaN amplification circuitry, wherein the input limiter is operable to inhibit the GaN amplification circuitry from operating in compression to thereby improve recovery time.

18. A method of radio frequency (RF) communication, the method comprising:
    selecting an amount of output limiting provided by a controllable output limiter of a low noise amplifier (LNA), the controllable output limiter comprising one or more diodes;
    amplifying an RF input signal to generate an RF output signal using the LNA;
    limiting the RF output signal using the one or more diodes of the controllable output limiter;
    providing the RF output signal from the LNA to a downstream circuit; and
    protecting the downstream circuit from damage by limiting the RF output signal using the controllable output limiter.

19. The method claim 18, further comprising:
receiving a reference voltage via a wire bond; and
selectively activating or deactivating controllable output limiter in response to receiving the reference voltage.

20. The method claim 18, further comprising:
receiving a DC input voltage at a pin of the semiconductor die; and
controlling the amount of output limiting based at least in part on the a voltage level of the DC input voltage.

* * * * *

UNITED STATES PATENT AND TRADEMARK OFFICE
CERTIFICATE OF CORRECTION

| | | |
|---|---|---|
| PATENT NO. | : 10,404,313 B1 | Page 1 of 1 |
| APPLICATION NO. | : 15/901071 | |
| DATED | : September 3, 2019 | |
| INVENTOR(S) | : Keith E. Benson | |

It is certified that error appears in the above-identified patent and that said Letters Patent is hereby corrected as shown below:

On the Title Page

Page 2, Column 2, Line 3, under Other Publications, change "Amsterdamn," to --Amsterdam,--.

Page 2, Column 2, Line 7, under Other Publications, change "Inegrated" to --Integrated--.

In the Specification

Column 9, Line 32, change "on off" to --on--.

Column 9, Line 46, change "on off" to --on--.

In the Claims

Column 16, Line 41, in Claim 19, change "method" to --method of--.

Column 16, Line 45 (approx.), in Claim 20, change "method" to --method of--.

Column 16, Line 49, in Claim 20, change "the a" to --a--.

Signed and Sealed this
Twenty-eighth Day of January, 2020

Andrei Iancu
*Director of the United States Patent and Trademark Office*